(12) United States Patent
Shimada et al.

(10) Patent No.: US 8,532,591 B2
(45) Date of Patent: Sep. 10, 2013

(54) TRANSMISSION CIRCUIT

(75) Inventors: Mikihiro Shimada, Osaka (JP); Ryo Kitamura, Kanagawa (JP); Kaoru Ishida, Kanagawa (JP); Hiroshi Komori, Shiga (JP)

(73) Assignee: Panasonic Corporation, Osaka (JP)

( * ) Notice: Subject to any disclaimer, the term of this patent is extended or adjusted under 35 U.S.C. 154(b) by 124 days.

(21) Appl. No.: 13/383,256

(22) PCT Filed: Jun. 2, 2010

(86) PCT No.: PCT/JP2010/003688
§ 371 (c)(1),
(2), (4) Date: Jan. 10, 2012

(87) PCT Pub. No.: WO2011/007496
PCT Pub. Date: Jan. 20, 2011

(65) Prior Publication Data
US 2012/0106403 A1    May 3, 2012

(30) Foreign Application Priority Data

Jul. 14, 2009 (JP) ................................ 2009-166026

(51) Int. Cl.
*H04B 1/02* (2006.01)
(52) U.S. Cl.
USPC .................... 455/108; 455/127.1
(58) Field of Classification Search
CPC ....................................................... H03C 5/00
USPC ........................... 455/102, 108, 127.1–127.5
See application file for complete search history.

(56) References Cited

U.S. PATENT DOCUMENTS 6,163,215 A    12/2000  Shibata et al.
7,565,118 B2 *  7/2009  Hara ............................. 455/108
(Continued)

FOREIGN PATENT DOCUMENTS

JP         7-30445      1/1995
JP      2000-174576    6/2000
(Continued)

OTHER PUBLICATIONS

International Search Report issued Jul. 6, 2010 in corresponding International Application No. PCT/JP2010/003688.

*Primary Examiner* — Lana N Le
(74) *Attorney, Agent, or Firm* — Wenderoth, Lind & Ponack, L.L.P.

(57) ABSTRACT

A transmission circuit according to the present invention includes: an amplitude signal driving section (220) that generates a control voltage based on an amplitude signal in a high-output mode, and generates a control voltage at a predetermined level and a bias current based on the amplitude signal in a low-output mode; a variable gain adjustment section (114) that adjusts a power level of the phase signal; and a power amplifier (130) which amplitude-modulates the phase signal having the adjusted power level on the basis of the control voltage, in the high-output mode, and to a power supply terminal of which the control voltage is supplied and which amplitude-modulates the phase signal having the adjusted power level on the basis of the bias current, in the low-output mode. In a specific region in a low-output region and close to a high-output region, the variable gain adjustment section (114) adjusts the power level of the phase signal to a predetermined upper-limit level, and the amplitude signal driving section (220) adjusts a gain of the power amplifier (130) to obtain a desired output power level.

11 Claims, 12 Drawing Sheets

(56) References Cited

U.S. PATENT DOCUMENTS

| | | | |
|---|---|---|---|
| 7,783,269 B2 * | 8/2010 | Vinayak et al. | 455/127.2 |
| 7,933,570 B2 * | 4/2011 | Vinayak et al. | 455/127.1 |
| 8,022,761 B2 * | 9/2011 | Drogi et al. | 330/136 |
| 8,188,788 B2 * | 5/2012 | Lee | 330/134 |
| 8,369,801 B2 * | 2/2013 | Shimizu et al. | 455/108 |
| 2004/0121790 A1 | 6/2004 | Wolff et al. | |
| 2008/0009248 A1 * | 1/2008 | Rozenblit et al. | 455/127.1 |
| 2008/0051044 A1 | 2/2008 | Takehara | |

FOREIGN PATENT DOCUMENTS

| | | |
|---|---|---|
| JP | 2005-117315 | 4/2005 |
| JP | 2008-28509 | 2/2008 |
| WO | 2008/023414 | 2/2008 |

* cited by examiner

| Pout [dBm] | Pin [dBm] | Gain [dB] | Vcc [V] | Ibias [mA] |
|---|---|---|---|---|
| 12 | -18 | 30 | 1.5 | 0.75 |
| 11 | -18 | 29 | 1.4 | 0.70 |
| 10 | -18 | 28 | 1.3 | 0.65 |
| 9 | -18 | 27 | 1.2 | 0.60 |
| 8 | -18 | 26 | 1.1 | 0.55 |
| 7 | -18 | 25 | 1.0 | 0.50 |
| 2 | -18 | 20 | 1.0 | 0.40 |
| 1 | -19 | 20 | 1.0 | 0.40 |
| 0 | -20 | 20 | 1.0 | 0.40 |
| -10 | -30 | 20 | 1.0 | 0.40 |
| -20 | -40 | 20 | 1.0 | 0.40 |
| -30 | -50 | 20 | 1.0 | 0.40 |
| -40 | -60 | 20 | 1.0 | 0.40 |
| -50 | -70 | 20 | 1.0 | 0.40 |

GAIN ADJUSTMENT REGION

LOW-OUTPUT REGION

TRANSMISSION CIRCUIT

TECHNICAL FIELD

The present invention relates to a transmission circuit that polar-modulates an input transmission signal, and in particular, relates to a transmission circuit that ensures a wide dynamic range using polar modulation.

BACKGROUND ART

It is desirable that a communication apparatus such as a mobile phone or a wireless LAN should operate with a low power consumption while ensuring the accuracy of a transmission signal, regardless of the magnitude of the output power level. Thus, to the communication apparatus, a transmission circuit using polar modulation is applied that is small in size, operates at a high efficiency, and outputs a transmission signal having a high linearity.

FIG. 12 is a diagram showing a conventional transmission circuit 900 using polar modulation. In FIG. 12, the conventional transmission circuit 900 using polar modulation includes a radio frequency integrated circuit (RF-IC) 910, a control voltage supply section 920, and a power amplifier (PA) 930. Further, the radio frequency integrated circuit 910 includes a signal generation section 911, a DA converter (DAC) 912, a phase modulator (PM) 913, and a variable gain adjustment section (VGA) 914.

An input signal input to the signal generation section 911 is decomposed into an amplitude signal M and a phase signal P. Between the two signals, the amplitude signal M is input to the control voltage supply section 920 via the DA converter 912. The control voltage supply section 920 generates a control voltage Vcc on the basis of the input amplitude signal, and supplies the control voltage Vcc to the power supply terminal of the power amplifier 930. The phase signal P is phase-modulated by the phase modulator 913, and is input to an input terminal of the power amplifier 930 via the variable gain adjustment section 914. The power amplifier 930 amplitude-modulates, on the basis of the control voltage Vcc supplied from the control voltage supply section 920, the phase signal input from the variable gain adjustment section 914, and outputs the resulting signal as a transmission signal.

In a high-output region, the conventional transmission circuit 900 using polar modulation operates in a high-output mode, and causes the power amplifier 930 to operate in a saturation region. Specifically, the input power level of the phase signal to be input from the variable gain adjustment section 914 to the power amplifier 930 is fixed, and the phase signal having the fixed input power level is amplitude-modulated on the basis of the control voltage Vcc from the control voltage supply section 920.

In a low-output region, on the other hand, the conventional transmission circuit 900 using polar modulation operates in a low-output mode, and causes the power amplifier 930 to operate in a linear region. Specifically, the phase signal to be input to the power amplifier 930 via the variable gain adjustment section 914 is amplitude-modulated on the basis of the control voltage Vcc from the control voltage supply section 920.

Here, for example, the UMTS (Universal Mobile Telephone System) requires an increase in the bandwidth of a transmission signal. This requires an increase in the dynamic range of the power amplifier 930, using the high-output region and the low-output region together.

SUMMARY OF THE INVENTION

Problems to be Solved by the Invention

In the low-output region, however, the above conventional transmission circuit 900 using polar modulation operates in the low-output mode. Accordingly, the control voltage supply section 920 generates the control voltage Vcc on the basis of the input amplitude signal, and therefore supplies the control voltage Vcc at a low level to the power amplifier 930. The control voltage Vcc supplied at a low level makes the power amplifier 930 sensitive to temperature fluctuations and voltage fluctuations. That is, in the low-output region, it is difficult to predict the individual variations of the power amplifier 930, and therefore not possible to compensate for the distortion characteristics. This results in the deterioration of the distortion characteristics, and therefore, it is not possible to secure a wide dynamic range of the power amplifier 930.

Therefore, it is an object of the present invention to provide a transmission circuit capable of ensuring a wide dynamic range by preventing the deterioration of the distortion characteristics in a low-output region where a transmission circuit using polar modulation causes a power amplifier to operate in a linear region.

Solution to the Problems

To achieve the above object, a transmission circuit according to the present invention is a transmission circuit that polar-modulates an input signal by switching an operation mode between a high-output mode in which the transmission circuit operates in a high-output region and a low-output mode in which the transmission circuit operates in a low-output region, the transmission circuit including: a signal generation section that generates an amplitude signal and a phase signal on the basis of the input signal; an amplitude signal driving section that generates a first control voltage based on the amplitude signal in the high-output mode, and generates a second control voltage at a predetermined level and a first bias current based on the amplitude signal in the low-output mode; a variable gain adjustment section that adjusts a power level of the phase signal; and a power amplifier: to a power supply terminal of which the first control voltage is supplied and which amplitude-modulates the phase signal having the adjusted power level on the basis of the first control voltage, in the high-output mode; and to the power supply terminal of which the second control voltage is supplied and to an input terminal of which the first bias current is supplied and which amplitude-modulates the phase signal having the adjusted power level on the basis of the first bias current and the second control voltage, in the low-output mode, wherein in a specific region in the low-output region and close to the high-output region, the variable gain adjustment section adjusts the power level of the phase signal to a predetermined upper-limit level, and the amplitude signal driving section operates in a special low-output mode in which a gain of the power amplifier is adjusted by changing the second control voltage and the first bias current to obtain a desired output power level.

In addition, it is preferable that in the special low-output mode, the amplitude signal driving section should increase the gain of the power amplifier in order to compensate for a difference between an input power level of the power amplifier in linear operation and the predetermined upper-limit level.

In addition, it is preferable that in the special low-output mode, the amplitude signal driving section should generate a third control voltage having a higher value of voltage than that of the second control voltage, and should also generate a second bias current having a greater amount of current than that of the first bias current.

In addition, typically, the low-output region includes a low-distortion region where a small deterioration of distortion characteristics is caused and a distortion characteristics deterioration region where a greater deterioration of the distortion characteristics than that of the low-distortion region is caused, and the specific region in the low-output region and close to the high-output region is the distortion characteristics deterioration region.

In addition, typically, the transmission circuit switches the operation mode to any one of the high-output mode, the low-output mode, and the special low-output mode in accordance with an output power level of the power amplifier.

In addition, it is preferable that the transmission circuit should switch the operation mode to any one of the high-output mode, the low-output mode, and the special low-output mode on the basis of a lookup table that defines the output power level of the power amplifier and the operation mode.

In addition, it is preferable that the transmission circuit should switch the operation mode to: the low-output mode when the output power level of the power amplifier is less than a first threshold; the special low-output mode when the output power level of the power amplifier is less than a second threshold and equal to or greater than the first threshold; and the high-output mode when the output power level of the power amplifier is equal to or greater than the second threshold.

In addition, typically, the transmission circuit causes the power amplifier to operate in a saturation region in the high-output mode, and causes the power amplifier to operate in a linear region in the low-output mode and the special low-output mode.

To achieve the above object, a communication apparatus according to the present invention is a communication apparatus including: a transmission circuit that generates a transmission signal; and an antenna that outputs the transmission signal generated by the transmission circuit, wherein the transmission circuit is the transmission circuit described above.

In addition, it is preferable that the communication apparatus should further include: a reception circuit that processes a reception signal received from the antenna; and an antenna duplexer that outputs to the antenna the transmission signal generated by the transmission circuit, and outputs to the reception circuit the reception signal received from the antenna.

To achieve the above object, a method according to the present invention is a method of polar-modulating an input signal by switching an operation mode between a high-output mode in which an operation is performed in a high-output region and a low-output mode in which the operation is performed in a low-output region, the method including: a signal generation step of generating an amplitude signal and a phase signal on the basis of the input signal; an amplitude signal driving step of generating a first control voltage based on the amplitude signal in the high-output mode, and generating a second control voltage at a predetermined level and a bias current based on the amplitude signal in the low-output mode; a variable gain adjustment step of adjusting a power level of the phase signal; and an amplitude modulation step, using a power amplifier, of: amplitude-modulating the phase signal having the adjusted power level on the basis of the first control voltage supplied to a power supply terminal of the power amplifier, in the high-output mode; and amplitude-modulating the phase signal having the adjusted power level on the basis of the bias current supplied to an input terminal of the power amplifier and the second control voltage supplied to the power supply terminal, in the low-output mode, wherein in a specific region in the low-output region and close to the high-output region, in the variable gain adjustment step, the power level of the phase signal is adjusted to a predetermined upper-limit level, and in the amplitude signal driving step, a gain of the power amplifier is adjusted by changing the second control voltage and the bias current to obtain a desired output power level.

Advantageous Effects of the Invention

As described above, based on the present invention, a control voltage to be supplied to a power amplifier is maintained at a predetermined level in a low-output region where a transmission circuit using polar modulation causes a power amplifier to operate in a linear region. This makes it possible to achieve a transmission circuit capable of preventing the deterioration of the distortion characteristics and ensuring a wide dynamic range.

DESCRIPTION OF EMBODIMENTS

With reference to the drawings, descriptions are given below of embodiments of the present invention.

First Embodiment

Figure 1:
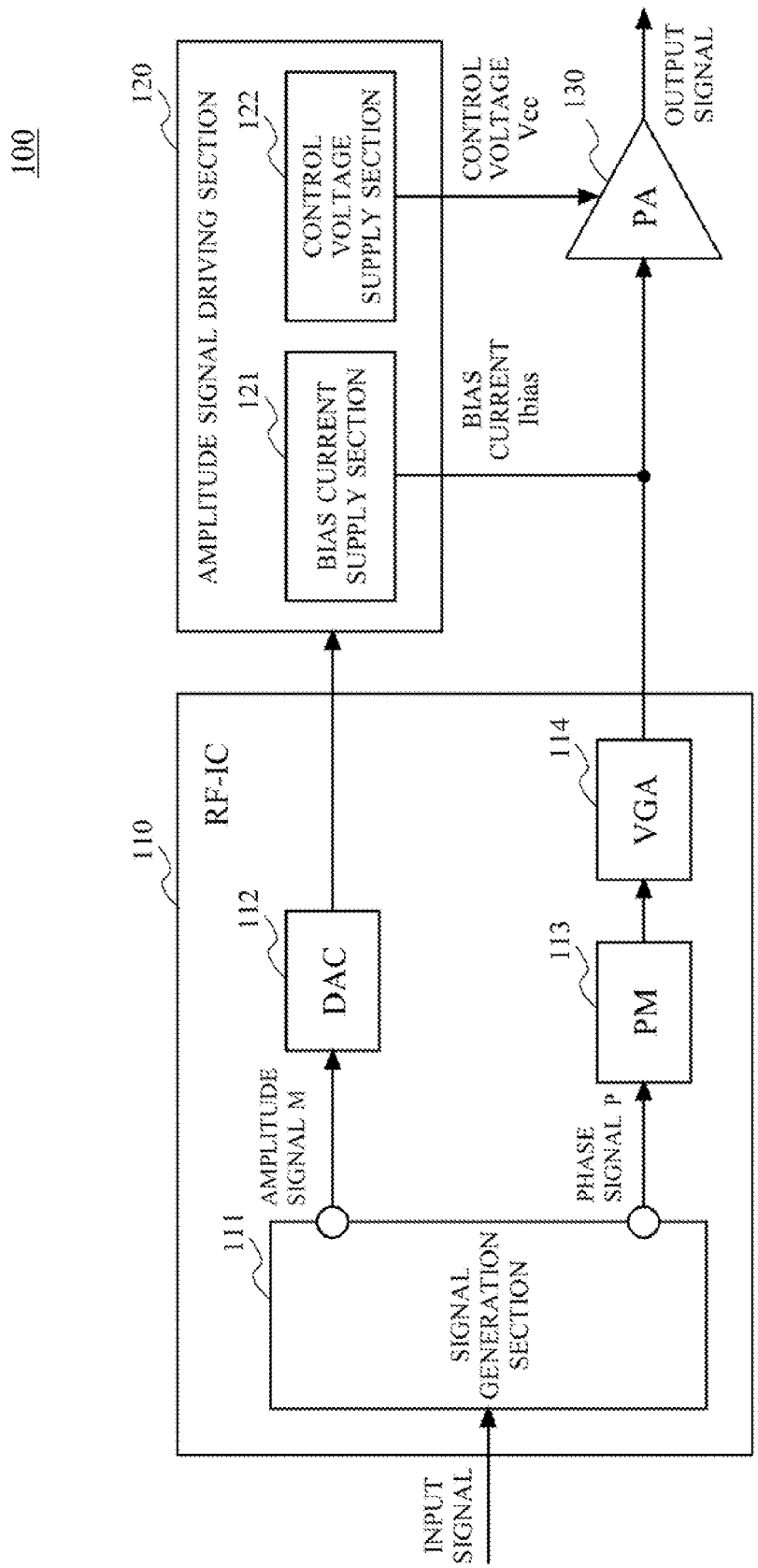
FIG. 1 is a diagram showing a transmission circuit 100 according to a first embodiment of the present invention.

FIG. 1 is a diagram showing a transmission circuit 100 according to a first embodiment of the present invention. In FIG. 1, the transmission circuit 100 according to the first embodiment of the present invention includes a radio frequency integrated circuit (RF-IC) 110, an amplitude signal driving section 120, and a power amplifier (PA) 130. It should be noted that the radio frequency integrated circuit 110 includes a signal generation section 111, a DA converter (DAC) 112, a phase modulator (PM) 113, and a variable gain adjustment section (VGA) 114. Further, the amplitude signal driving section 120 includes a bias current supply section 121 and a control voltage supply section 122.

An input signal input to the signal generation section 111 is decomposed into an amplitude signal M and a phase signal P. Between the two signals, the amplitude signal M is input to the amplitude signal driving section 120 via the DA converter 112. The amplitude signal driving section 120 generates a control voltage Vcc or a bias current Ibias on the basis of the input amplitude signal, and supplies the control voltage Vcc or the bias current Ibias to the power supply terminal or an input terminal of the power amplifier 130. The phase signal P is phase-modulated by the phase modulator 113, and is input to the input terminal of the power amplifier 130 via the variable gain adjustment section 114. The power amplifier 130 amplitude-modulates, on the basis of the control voltage Vcc or the bias current Ibias supplied from the amplitude signal driving section 120, the phase signal input from the variable gain adjustment section 114, and outputs the resulting signal as a transmission signal.

A detailed description is given here of the control voltage Vcc and the bias current Ibias that are supplied from the amplitude signal driving section 120 to the power amplifier 130.

Figure 2:
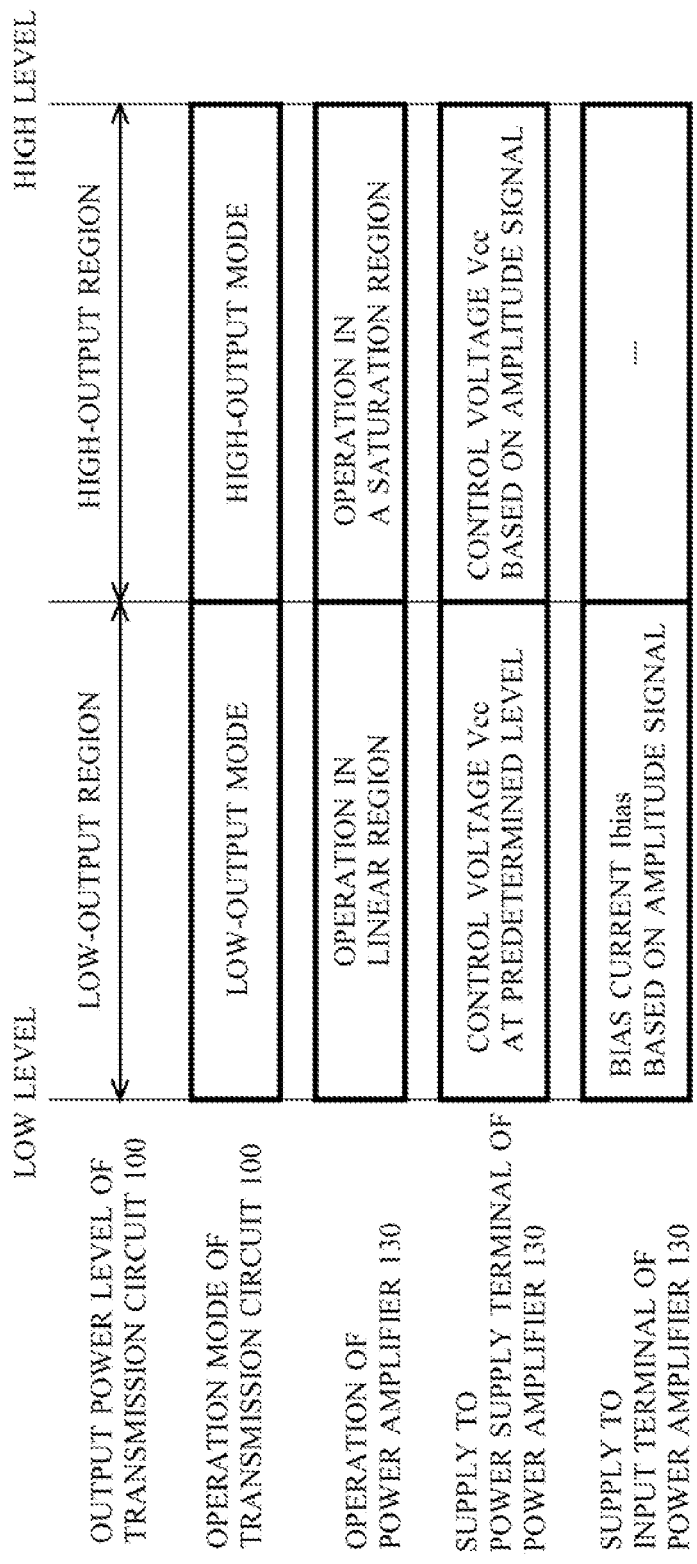
FIG. 2 is a diagram showing the operation, in a high-output region and a low-output region, of a power amplifier 130 of the transmission circuit 100 according to the first embodiment of the present invention.

FIG. 2 is a diagram showing the operation, in a high-output region and a low-output region, of the power amplifier 130 of the transmission circuit 100 according to the first embodiment of the present invention. Referring to FIG. 2, in the high-output region, the transmission circuit 100 according to the first embodiment of the present invention operates in a high-output mode, and causes the power amplifier 130 to operate in a saturation region. Specifically, the input power level of the phase signal to be input from the variable gain adjustment section 114 to the power amplifier 130 is fixed, and the phase signal having the fixed input power level is amplitude-modulated on the basis of the control voltage Vcc from the amplitude signal driving section 120. In this case, the control voltage supply section 122 of the amplitude signal driving section 120 generates the control voltage Vcc on the basis of the amplitude signal input from the DA converter 112, and supplies the generated control voltage Vcc to the power supply terminal of the power amplifier 130.

As described above, in the high-output region, the transmission circuit 100 according to the first embodiment of the present invention operates in a high-output mode similar to that of the conventional transmission circuit 900 using polar modulation.

Referring to FIG. 2, in the low-output region, on the other hand, the transmission circuit 100 according to the first embodiment of the present invention operates in a low-output mode, and causes the power amplifier 130 to operate in a linear region. Specifically, the phase signal to be input to the power amplifier 130 via the variable gain adjustment section 114 is amplitude-modulated on the basis of the bias current Ibias from the amplitude signal driving section 120. In this case, the bias current supply section 121 of the amplitude signal driving section 120 generates the bias current Ibias on the basis of the amplitude signal input from the DA converter 112, and supplies the generated bias current Ibias to the input terminal of the power amplifier 130. Further, the control voltage supply section 122 of the amplitude signal driving section 120 supplies the control voltage Vcc at a predetermined level to the power supply terminal of the power amplifier 130.

As described above, in the low-output region, the transmission circuit 100 according to the first embodiment of the present invention operates in a low-output mode different from that of the conventional transmission circuit 900 using polar modulation. The control voltage supply section 122 of the amplitude signal driving section 120 generates the control voltage Vcc at the predetermined level, and the bias current supply section 121 of the amplitude signal driving section 120 generates the bias current Ibias based on the amplitude signal. The generated control voltage Vcc at the predetermined level and the generated bias current Ibias based on the amplitude signal are supplied to the power supply terminal and the input terminal, respectively, of the power amplifier 130.

That is, to the power amplifier 130 of the transmission circuit 100 according to the first embodiment of the present invention, not the control voltage Vcc at a low level but the control voltage Vcc at the predetermined level is supplied. This makes the power amplifier 130 insensitive to temperature fluctuations and voltage fluctuations, and therefore enables the power amplifier 130 to compensate for the distortion characteristics.

As described above, the transmission circuit 100 according to the first embodiment of the present invention makes it possible to ensure a wide dynamic range by preventing the deterioration of the distortion characteristics in a low-output region where a transmission circuit using polar modulation causes a power amplifier to operate in a linear region.

It should be noted that, as described above, the transmission circuit 100 according to the first embodiment of the present invention switches the operation mode between the high-output mode and the low-output mode in accordance with the output power level. Here, the transmission circuit 100 according to the first embodiment of the present invention may further include a lookup table that defines the output power level and the operation mode, and switch the operation mode between the high-output mode and the low-output mode on the basis of the lookup table. Alternatively, the transmission circuit 100 according to the first embodiment of the present invention may retain the threshold for the output power level between both modes in a memory or the like in advance, and switch the operation mode between the high-output mode and the low-output mode on the basis of the output power level and the retained threshold.

Second Embodiment

Figure 3:
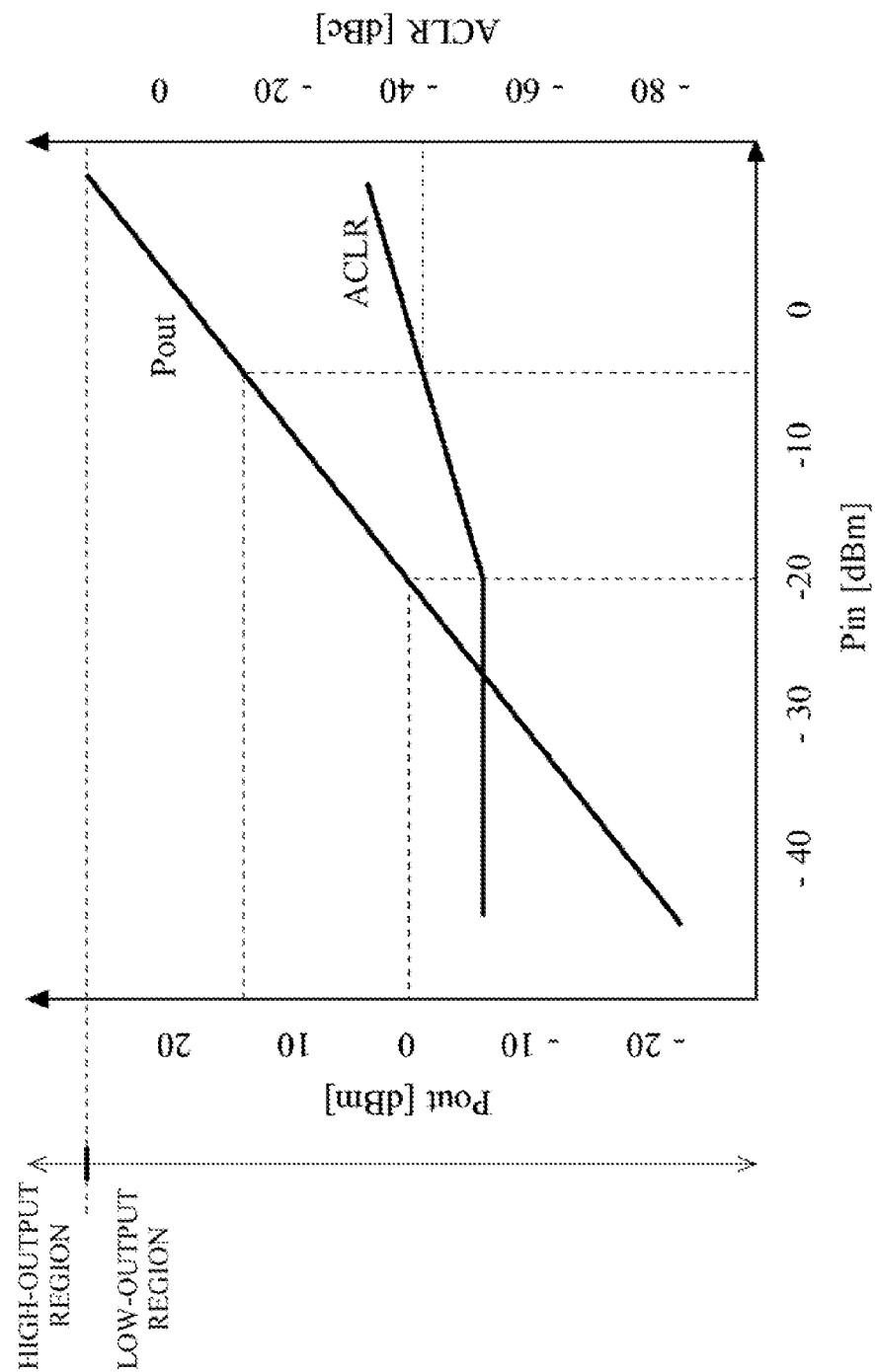
FIG. 3 is a diagram showing the relationship between the input and output powers and the distortion characteristics, in the low-output region, of the transmission circuit 100 according to the first embodiment of the present invention.

FIG. 3 is a diagram showing the relationship between the input and output powers and the distortion characteristics, in the low-output region, of the transmission circuit 100 according to the first embodiment of the present invention. In the low-output region, the transmission circuit 100 according to the first embodiment of the present invention operates in the low-output mode, supplies the control voltage Vcc at the predetermined level to the power supply terminal of the power amplifier 130, and also supplies the bias current Ibias based on the amplitude signal to the input terminal of the power amplifier 130. The supply of the control voltage Vcc at the predetermined level to the power amplifier 130 makes it possible to suppress the deterioration of the distortion characteristics.

As shown in FIG. 3, however, it is understood that in the transmission circuit 100 according to the first embodiment of the present invention, in a region in the low-output region and close to the high-output region, the closer to the high-output region, i.e., the greater an output power Pout, the greater the deterioration of the distortion characteristics (ACLR: Adjacent Channel Leakage Ratio). For example, the deterioration starts when the output power Pout is 0 dBm, and the ACLR deteriorates to near −40 dBc when the output power Pout=15 dBm. Thus, in a second embodiment, a description is given of the structure where in the transmission circuit 100 according to the first embodiment of the present invention, the deterioration of the distortion characteristics is further suppressed also in a region in the low-output region and close to the high-output region.

Figure 4:
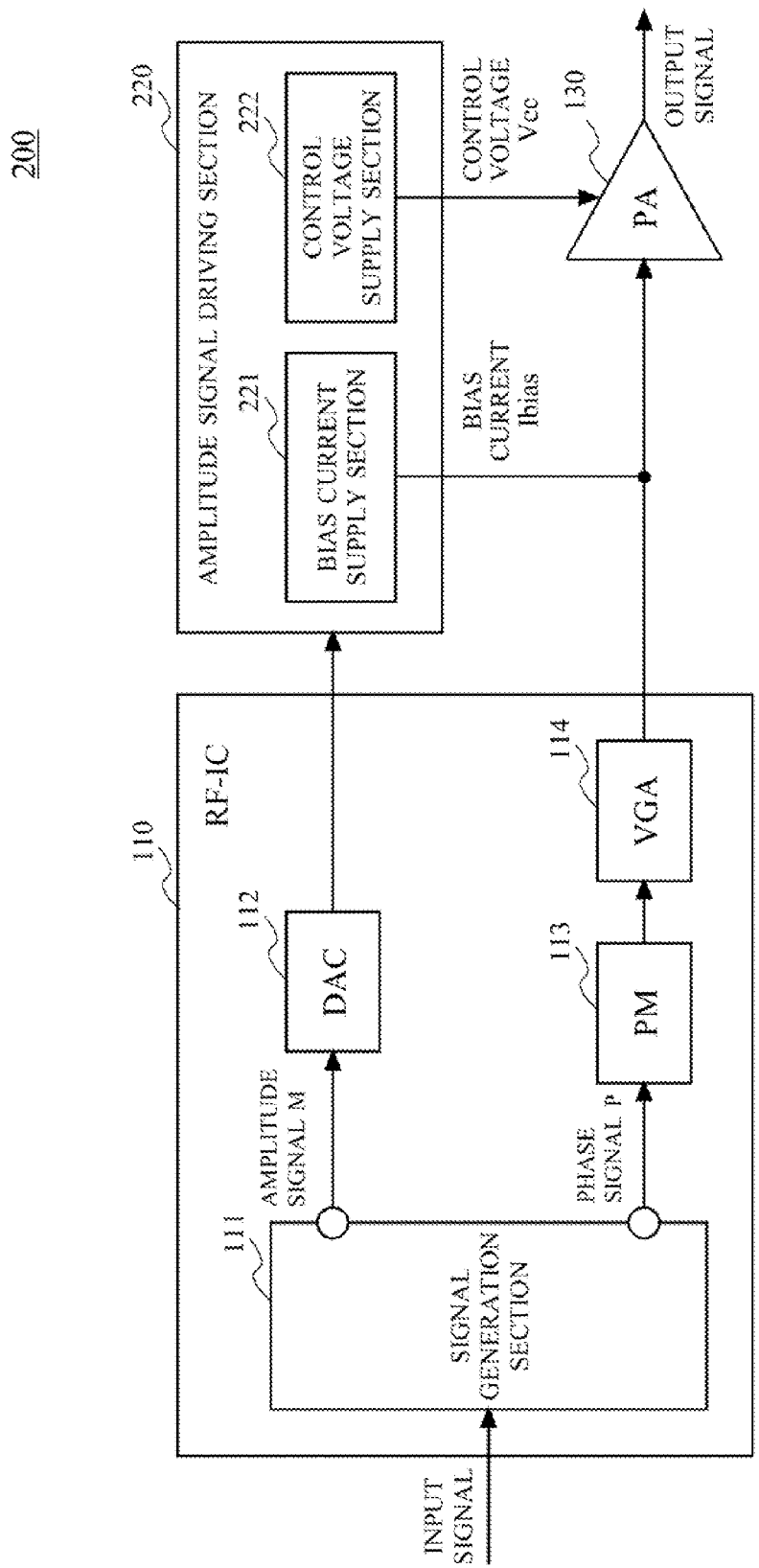
FIG. 4 is a diagram showing a transmission circuit 200 according to a second embodiment of the present invention.

FIG. 4 is a diagram showing a transmission circuit 200 according to the second embodiment of the present invention. In FIG. 4, the transmission circuit 200 according to the second embodiment of the present invention includes a radio frequency integrated circuit (RF-IC) 110, an amplitude signal driving section 220, and a power amplifier (PA) 130. It should be noted that the radio frequency integrated circuit 110 includes a signal generation section 111, a DA converter (DAC) 112, a phase modulator (PM) 113, and a variable gain adjustment section (VGA) 114. Further, the amplitude signal driving section 220 includes a bias current supply section 221 and a control voltage supply section 222. It should be noted that the transmission circuit 200 according to the second embodiment of the present invention is basically similar in structure to the transmission circuit 100 according to the first embodiment of the present invention. In FIG. 4, the components of the transmission circuit 200 according to the second embodiment of the present invention that are the same as those of the transmission circuit 100 according to the first embodiment of the present invention shown in FIG. 1 are denoted by the same numerals, and therefore are not described here.

In the low-output region, the transmission circuit 200 according to the second embodiment of the present invention operates in the low-output mode. At this time, however, the operations of the bias current supply section 221 and the control voltage supply section 222 of the amplitude signal driving section 220 are different from the operations of the bias current supply section 121 and the control voltage supply section 122 of the transmission circuit 100 according to the first embodiment of the present invention.

Figure 5:
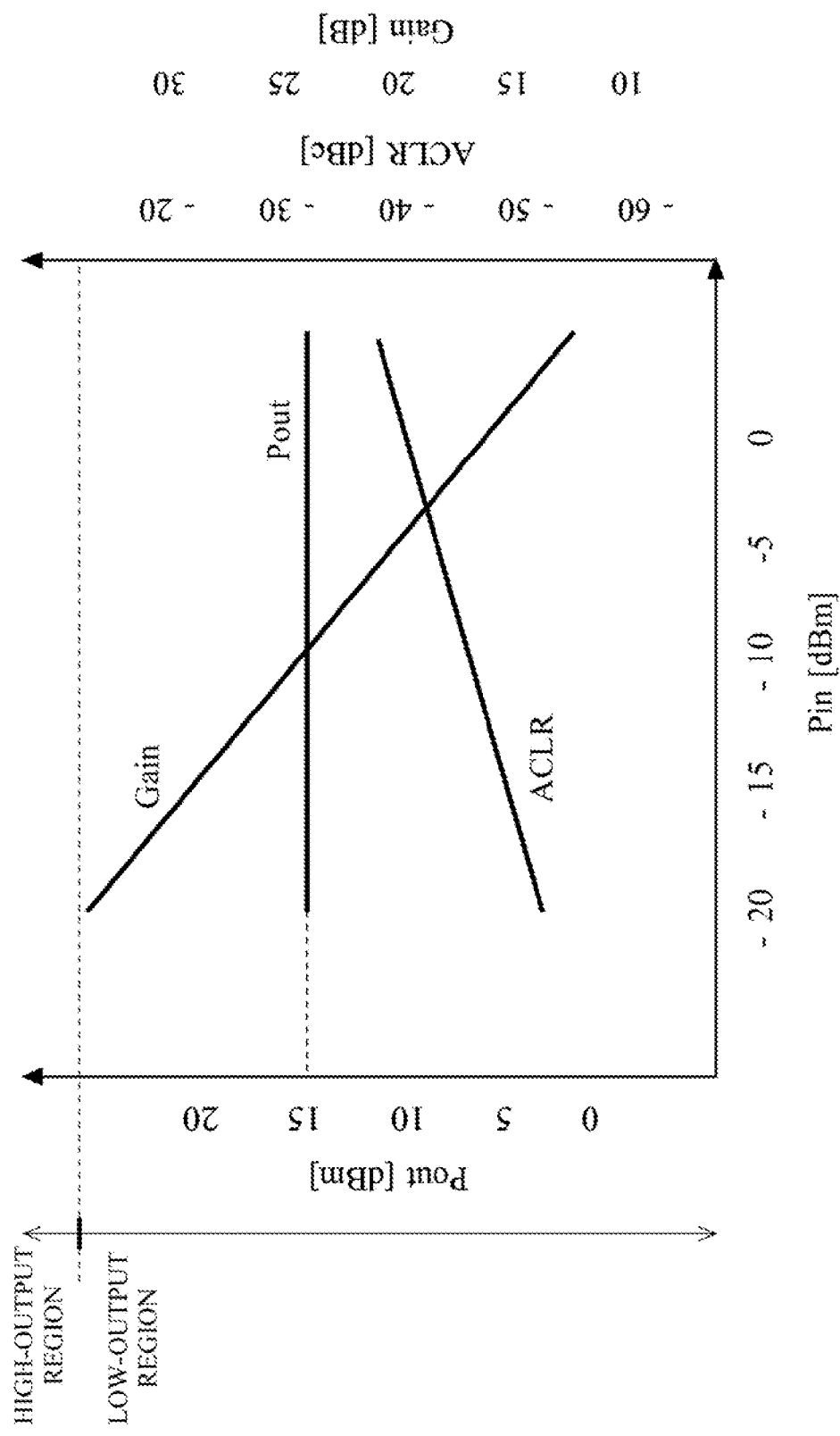
FIG. 5 is a diagram showing the state where an output power Pout is maintained at a constant level by adjusting the gain of a power amplifier 130 while changing an input power Pin.

FIG. 5 is a diagram showing the state where the output power Pout is maintained by adjusting a gain Gain of the power amplifier 130 while changing an input power Pin. Referring to FIG. 5, the gain Gain of the power amplifier 130 is adjusted while the input power Pin is changed in the range of from −20 to 0 dBm, such that the output power Pout is maintained at a constant level of 15 dBm. Referring to FIG. 3, when the output power Pout=15 dBm, the ACLR deteriorates to near −40 dBc. In this case, the input power Pin=−5 dBm. As shown in FIG. 5, however, the reduction of the input power Pin is successful in suppressing the deterioration of the ACLR.

As described above, in the transmission circuit 200 according to the second embodiment of the present invention, the reduction of the input power Pin makes it possible to suppress the deterioration of the distortion characteristics in a region in the low-output region and close to the high-output region. It should be noted that the variable gain adjustment section 114 reduces the input power Pin to be input to the power amplifier 130 by controlling the power level of the phase signal P from the signal generation section 111. Further, the variable gain adjustment section 114 is controlled by the radio frequency integrated circuit 110 in accordance with the input signal level.

Then, it is necessary to increase the gain Gain of the power amplifier 130 simultaneously while reducing the input power Pin, to obtain a desired output power Pout. The gain Gain of the power amplifier 130 is adjusted on the basis of the bias current Ibias from the bias current supply section 221 of the amplitude signal driving section 220, and the control voltage Vcc from the control voltage supply section 222 of the amplitude signal driving section 220.

Figure 6:
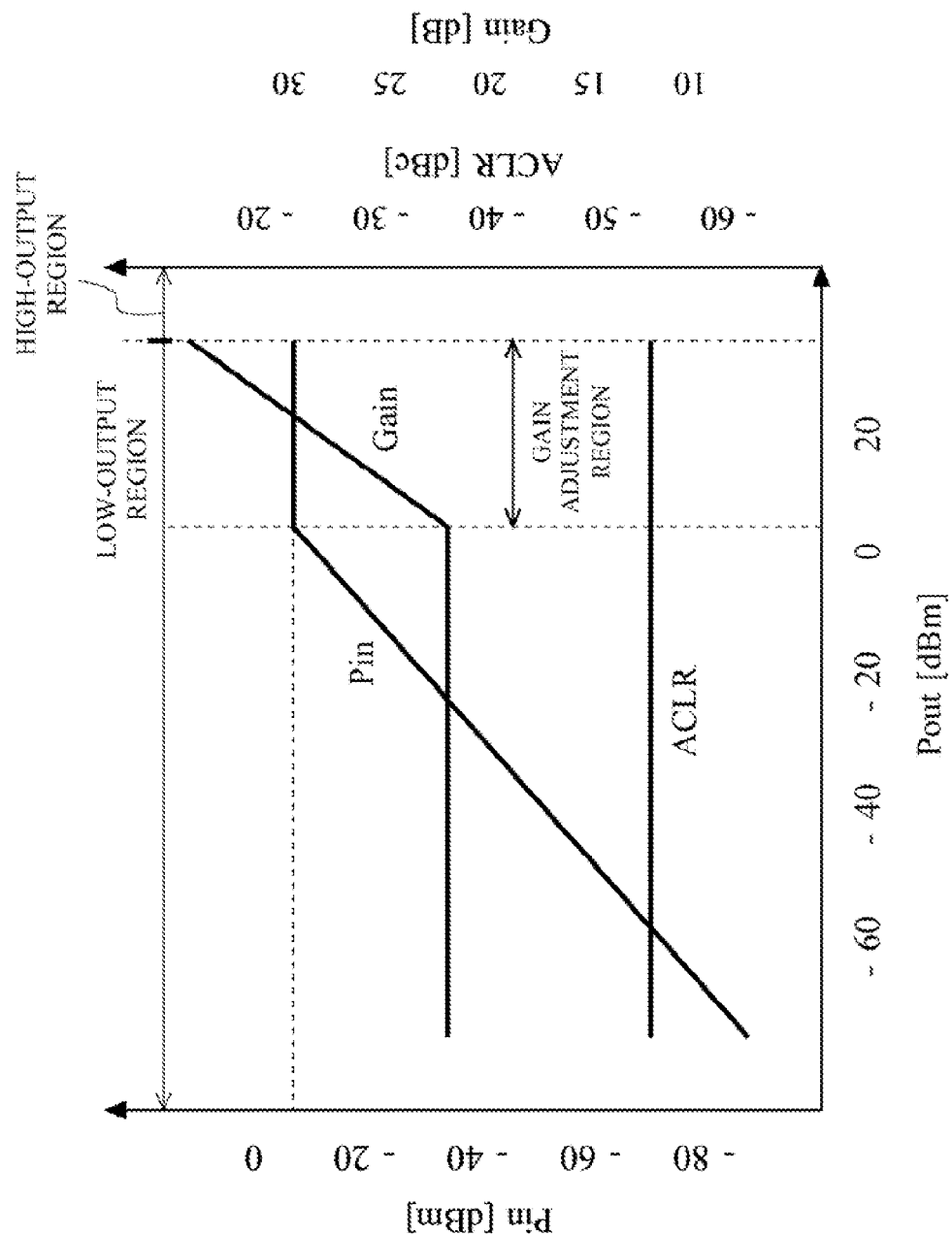
FIG. 6 is a diagram showing the relationship between the input power Pin and the gain of the power amplifier 130.

FIG. 6 is a diagram showing the relationship between the input power Pin and the gain Gain of the power amplifier 130. As shown in FIG. 6, in the transmission circuit 200 according to the second embodiment of the present invention, the input power Pin is maintained constant at −10 dBm without being increased in a gain adjustment region, which is a region in the low-output region and close to the high-output region. The output power Pout is adjusted by increasing the gain Gain of the power amplifier 130 simultaneously while maintaining the input power Pin constant at −10 dBm. This is successful in, in the transmission circuit 200 according to the second embodiment of the present invention, suppressing the deterioration of the ACLR even in a region in the low-output region and close to the high-output region.

Figure 7:
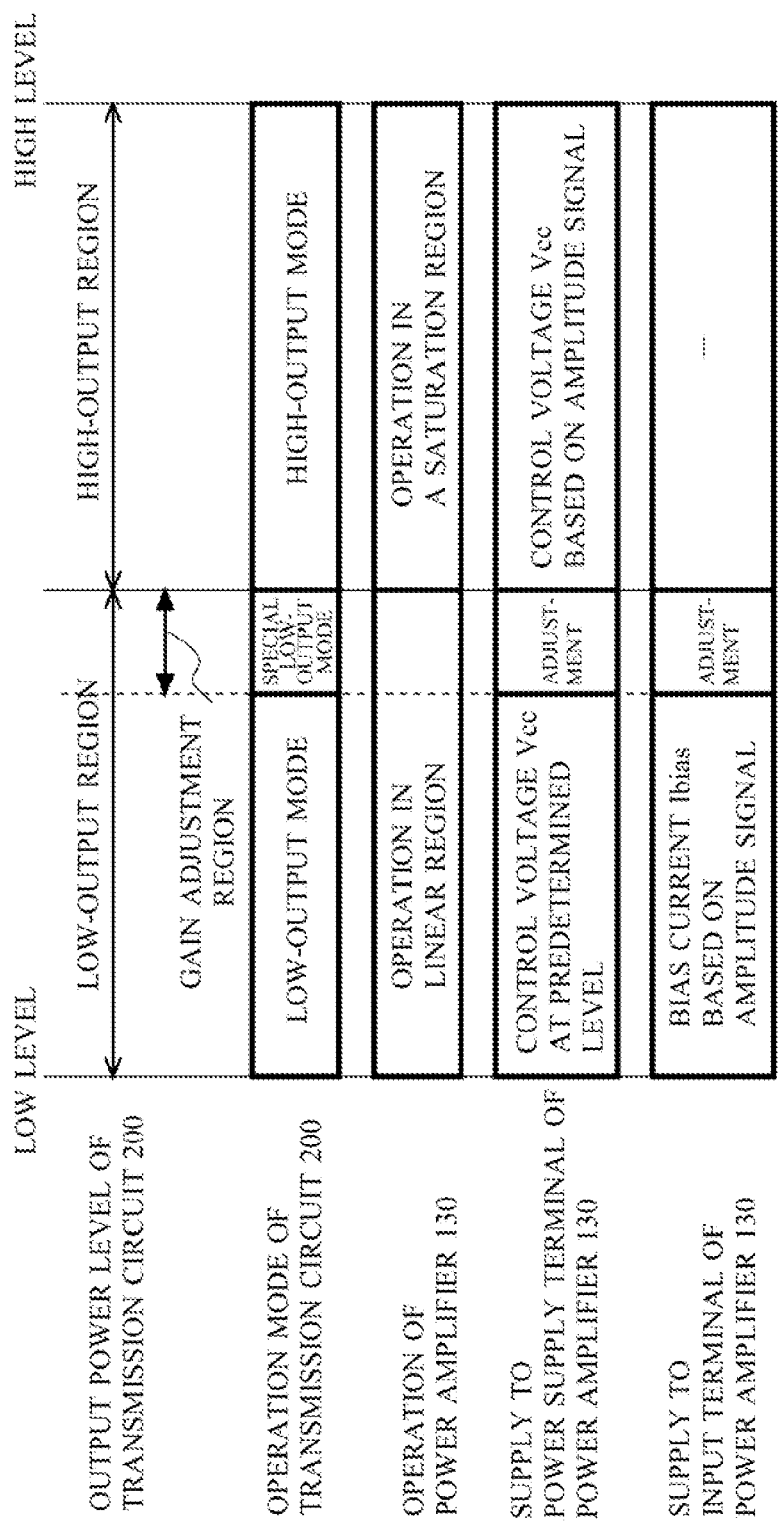
FIG. 7 is a diagram showing the operation, in a high-output region and a low-output region, of the power amplifier 130 of the transmission circuit 200 according to the second embodiment of the present invention.

FIG. 7 is a diagram showing the operation, in the high-output region and the low-output region, of the power amplifier 130 of the transmission circuit 200 according to the second embodiment of the present invention. Referring to FIG. 7, in the high-output region, the transmission circuit 200 according to the second embodiment of the present invention operates in a high-output mode, and causes the power amplifier 130 to operate in a saturation region. Specifically, the input power level of the phase signal to be input from the variable gain adjustment section 114 to the power amplifier 130 is fixed, and the phase signal having the fixed input power level is amplitude-modulated on the basis of the control voltage Vcc from the amplitude signal driving section 220. In this case, the control voltage supply section 222 of the amplitude signal driving section 220 generates the control voltage Vcc on the basis of the amplitude signal input from the DA converter 112, and supplies the generated control voltage Vcc to the power supply terminal of the power amplifier 130.

As described above, in the high-output region, the transmission circuit 200 according to the second embodiment of the present invention operates in a high-output mode similar to that of the conventional transmission circuit 900 using polar modulation, and that of the transmission circuit 100 according to the first embodiment of the present invention.

Referring to FIG. 7, in the low-output region, on the other hand, the transmission circuit 200 according to the second embodiment of the present invention operates in a low-output mode, and causes the power amplifier 130 to operate in a linear region. Specifically, the phase signal to be input to the power amplifier 130 via the variable gain adjustment section 114 is amplitude-modulated on the basis of the bias current Ibias from the amplitude signal driving section 220. In this case, the bias current supply section 221 of the amplitude signal driving section 220 generates the bias current Ibias on the basis of the amplitude signal input from the DA converter 112, and supplies the generated bias current Ibias to the input terminal of the power amplifier 130. Further, the control voltage supply section 222 of the amplitude signal driving section 220 supplies the control voltage Vcc at a predetermined level to the power supply terminal of the power amplifier 130.

Further, in the gain adjustment region, which is a region in the low-output region and close to the high-output region, the transmission circuit 200 according to the second embodiment of the present invention operates in a special low-output mode. Specifically, the variable gain adjustment section 114 adjusts the input power Pin, and simultaneously, the control voltage supply section 222 and the bias current supply section 221 of the amplitude signal driving section 220 adjust the levels of the control voltage Vcc and the bias current Ibias, respectively, so as to increase the gain Gain of the power amplifier 130.

As described above, in the gain adjustment region, which is a region in the low-output region and close to the high-output region, the transmission circuit 200 according to the second embodiment of the present invention operates in a special low-output mode different from the low-output mode of the transmission circuit 100 according to the first embodiment of the present invention.

Figure 8:
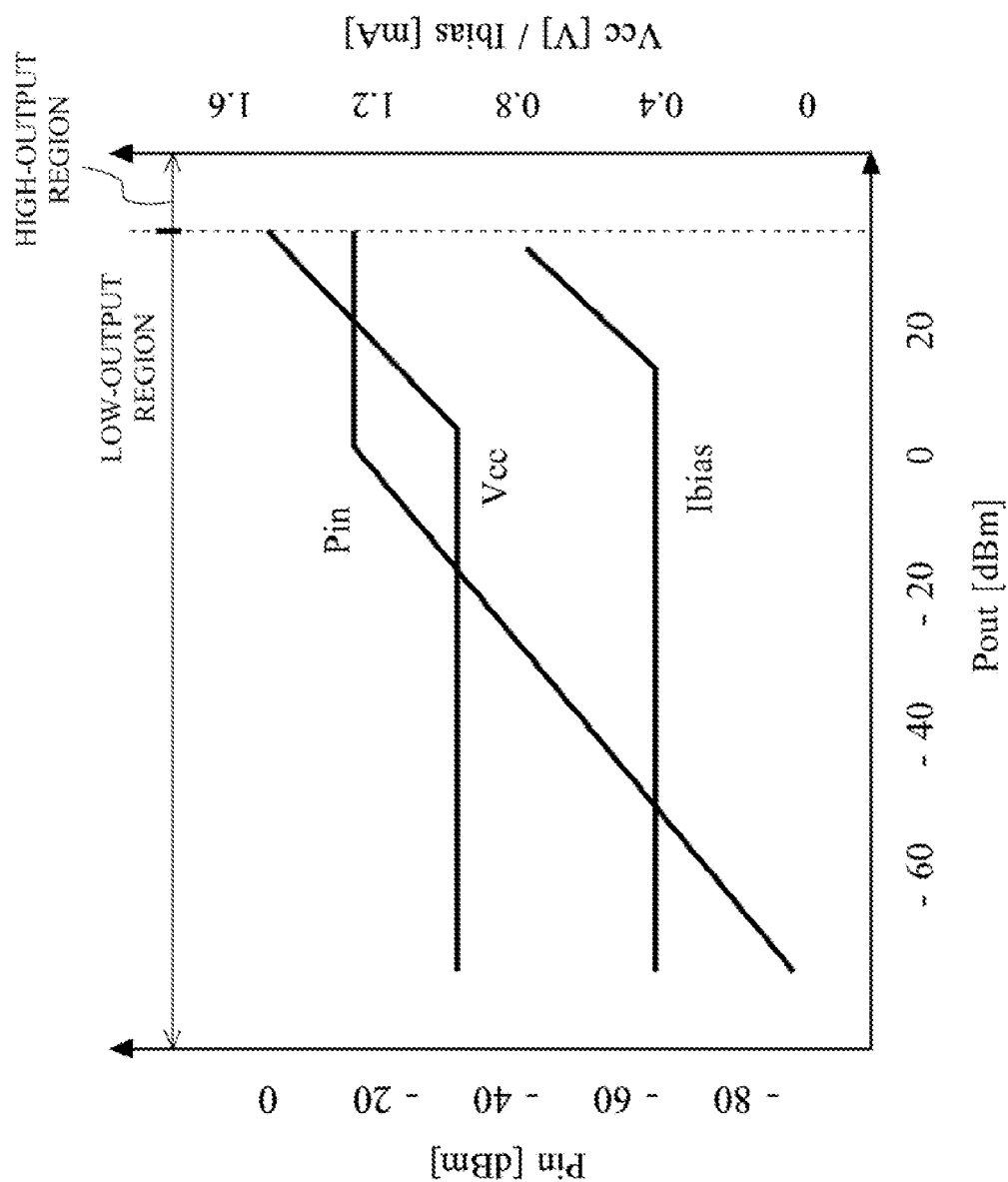
FIG. 8 is a diagram showing the relationships between the input power Pin and a bias current Ibias, and between the input power Pin and a control voltage Vcc, in the low-output region.
Figure 9:
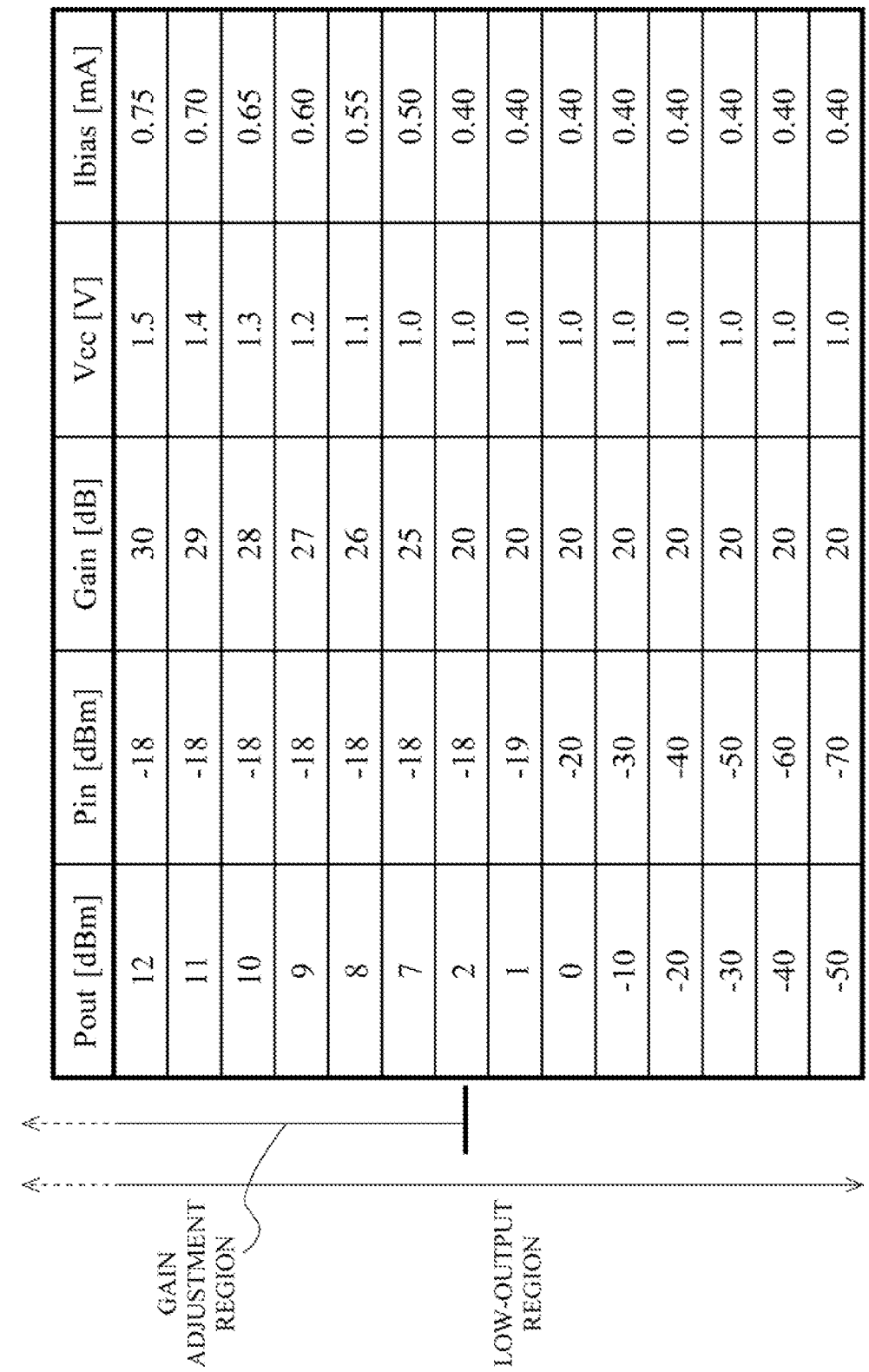
FIG. 9 is a diagram showing the relationships among the output power Pout, the input power Pin, a gain Gain, the control voltage Vcc, and the bias current Ibias, in the low-output region.

FIG. 8 is a diagram showing the relationships between the input power Pin and the bias current Ibias, and between the input power Pin and the control voltage Vcc, in the low-output region. FIG. 9 is a diagram showing the relationships among the output power Pout, the input power Pin, the gain Gain, the control voltage Vcc, and the bias current Ibias, in the low-output region. FIGS. 8 and 9 specifically show the operation, in the low-output region, of the transmission circuit 200 according to the second embodiment of the present invention, the operation shown in FIG. 7.

In the low-output region, the transmission circuit 200 according to the second embodiment of the present invention operates in the low-output mode, and causes the power amplifier 130 to operate in the linear region. When the output power Pout is from −60 to 0 dBm, the input power Pin is adjusted to from −80 to 0 dBm by the variable gain adjustment section 114. In this case, to adjust the gain Gain of the power amplifier 130 to 20 dB, the control voltage supply section 222 of the amplitude signal driving section 220 supplies the control voltage Vcc at a constant level (1.0 V) to the power supply terminal of the power amplifier 130, and the bias current supply section 221 of the amplitude signal driving section 220 supplies the bias current Ibias at a constant level (0.40 mA) to the input terminal of the power amplifier 130.

Next, in the gain adjustment region, which is a region in the low-output region and close to the high-output region, the transmission circuit 200 according to the second embodiment of the present invention operates in the special low-output mode. When the output power Pout is greater than 2 dBm, the input power Pin is adjusted by the variable gain adjustment section 114 so as not to exceed −18 dBm. In this case, it is necessary to increase the gain Gain of the power amplifier 130 to greater than 20 dB. Accordingly, the control voltage supply section 222 and the bias current supply section 221 of the amplitude signal driving section 220 adjust the control voltage Vcc and the bias current Ibias, respectively. As described above, the transmission circuit 200 according to the second embodiment of the present invention obtains a desired output power Pout by increasing the gain Gain of the power amplifier 130 while adjusting the input power Pin.

As described above, the transmission circuit 200 according to the second embodiment of the present invention makes it possible to ensure a wide dynamic range by preventing the deterioration of the distortion characteristics in a low-output region where a transmission circuit using polar modulation causes a power amplifier to operate in a linear region. Further, the transmission circuit 200 according to the second embodiment of the present invention makes it possible to further suppress the deterioration of the distortion characteristics also in a region in the low-output region and close to a high-output region.

It should be noted that, as described above, the transmission circuit 200 according to the second embodiment of the present invention switches the operation mode among the high-output mode, the low-output mode, and the special low-output mode in accordance with the output power level. Here, the transmission circuit 200 according to the second embodiment of the present invention may further include a lookup table that defines the output power level and the operation mode, and switch the operation mode among the high-output mode, the low-output mode, and the special low-output mode on the basis of the lookup table. Alternatively, the transmission circuit 200 according to the second embodiment of the present invention may retain the thresholds for the output power level among all the modes in a memory or the like in advance, and switch the operation mode among the high-output mode, the low-output mode, and the special low-output mode on the basis of the output power level and the retained threshold.

It should be noted that, for example, a bipolar transistor or a field-effect transistor may be applied to the power amplifier 130 shown in each of the transmission circuits 100 and 200 according to the first and second embodiments of the present invention. When a bipolar transistor is applied, the power supply terminal serves as the collector terminal, and the input terminal serves as the base terminal.

Figure 10:
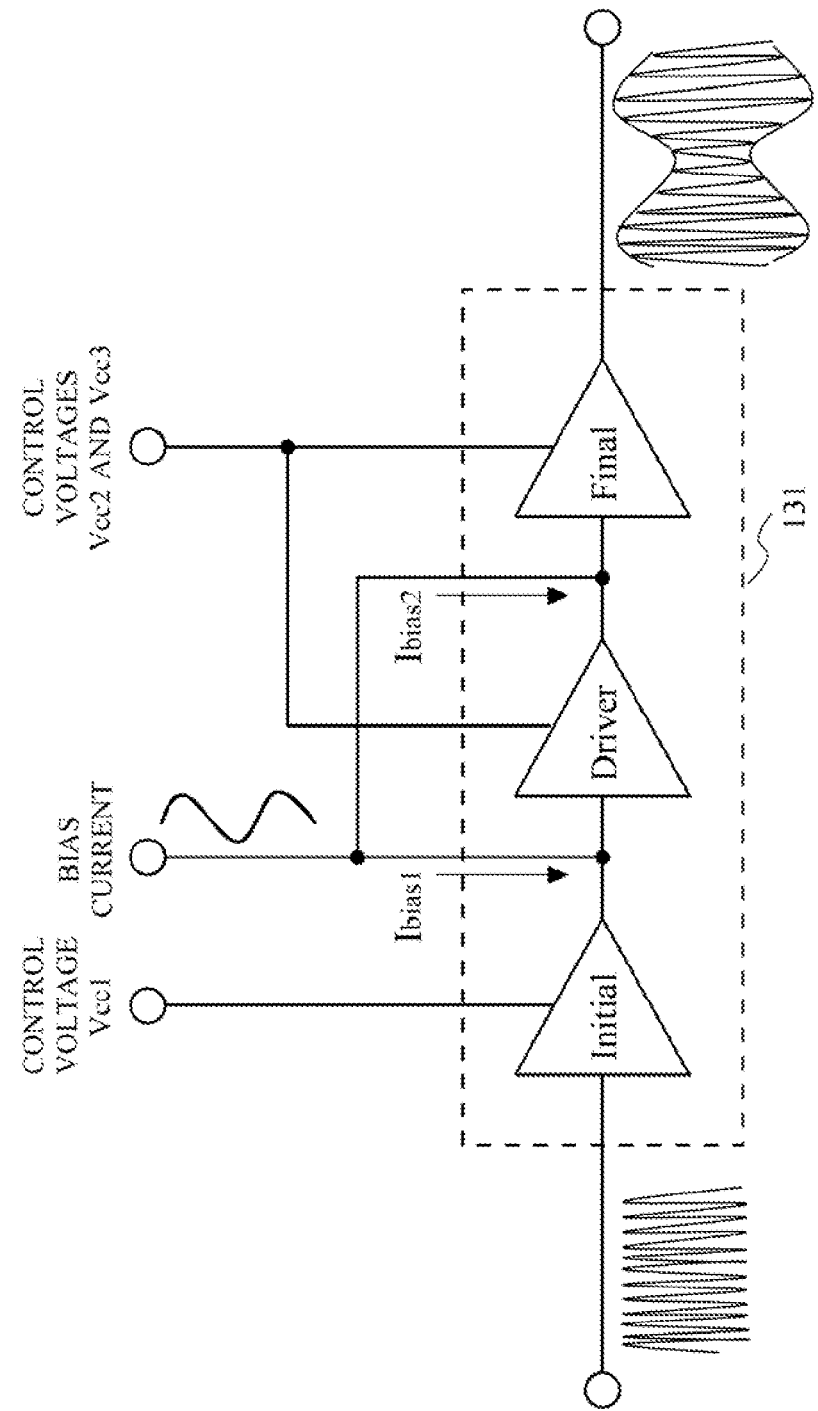
FIG. 10 is a diagram showing a power amplification module 131 having a three-stage configuration.

Further, the power amplifier 130 can be considered as one module, and may have, for example, a multistage configuration. FIG. 10 is a diagram showing a power amplification module 131 having a three-stage configuration. In FIG. 10, the power amplification module 131 includes a first stage (Initial), a second stage (Driver), and a final stage (Final). To the power supply terminals of the stages, control voltages Vcc1 through Vcc3 are supplied from a control voltage supply section of an amplitude signal driving section. To input terminals of the second and final stages, bias currents Ibias1 and Ibias2 are supplied from a bias current supply section of the amplitude signal driving section. As described above, it is needless to say that even when the power amplification module 131 having a three-stage configuration is used, it is possible to obtain similar effects to those of the transmission circuits 100 and 200 according to the first and second embodiments of the present invention by performing an operation similar to those of the transmission circuits 100 and 200.

Third Embodiment

Figure 11:
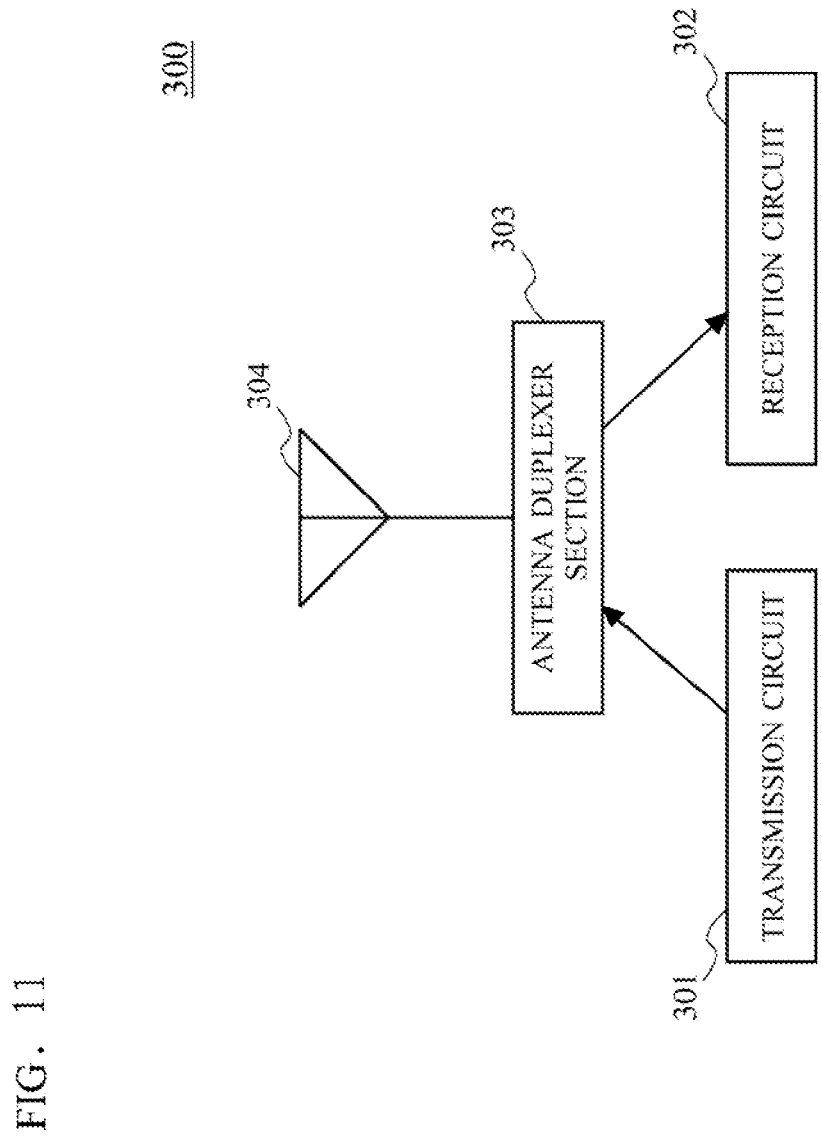
FIG. 11 is a diagram showing a communication apparatus 300 according to a third embodiment of the present invention.
Figure 12:
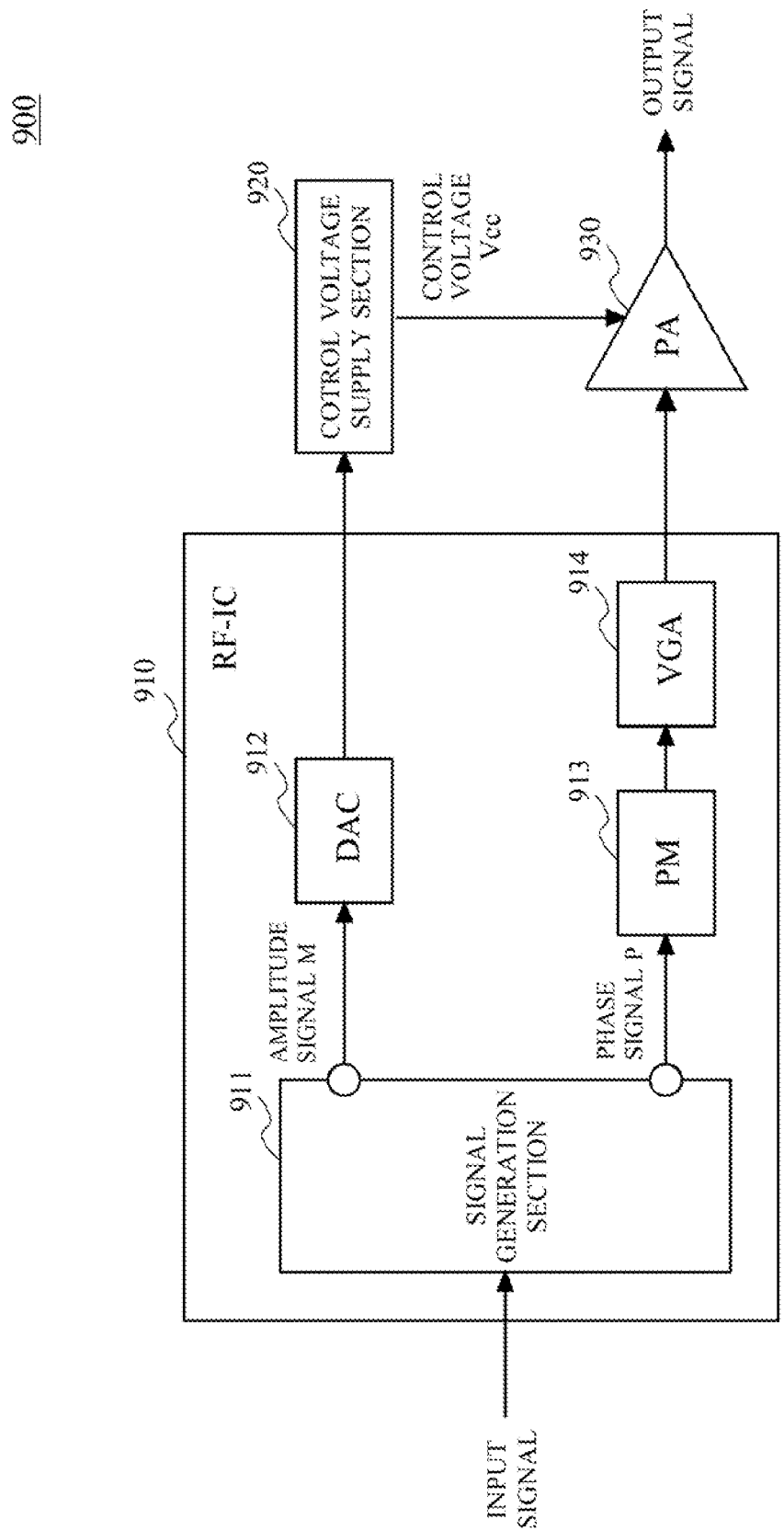
FIG. 12 is a diagram showing a conventional transmission circuit 900 using polar modulation.

FIG. 11 is a diagram showing a communication apparatus 300 according to a third embodiment of the present invention. In FIG. 11, the communication apparatus 300 includes a transmission circuit 301, a reception circuit 302, an antenna duplexer section 303, and an antenna 304. To the transmission circuit 301, either one of the transmission circuits 100 and 200 according to the first and second embodiments of the present invention described above is applied.

The antenna duplexer section 303 conveys to the antenna 304 a transmission signal output from the transmission circuit 301, and thereby prevents the transmission signal from leaking to the reception circuit 302. Further, the antenna duplexer section 303 conveys to the reception circuit 302 a reception signal input from the antenna 304, and thereby prevents the reception signal from leaking to the transmission circuit 301. The transmission signal is output from the transmission circuit 301, and is emitted to space from the antenna 304 via the antenna duplexer section 303. The reception signal is received by the antenna 304, and is received by the reception circuit 302 via the antenna duplexer section 303.

Here, to the transmission circuit 301, either one of the transmission circuits 100 and 200 according to the first and second embodiments of the present invention is applied. Thus, it is needless to say that the transmission circuit 301 produces effects similar to those described in the first and second embodiments of the present invention.

As described above, the communication apparatus 300 according to the third embodiment makes it possible to ensure a wide dynamic range by preventing the deterioration of the distortion characteristics in a low-output region where a transmission circuit using polar modulation causes a power amplifier to operate in a linear region.

In addition, the output of the transmission circuit 301 does not have a branch such as a directional coupler. This makes it possible to reduce the loss from the transmission circuit 301 to the antenna 304, and therefore reduce the power consumption at the time of transmission. This enables the long-term use of the transmission circuit 301 as a wireless communication apparatus. It should be noted that the communication apparatus 300 may include only the transmission circuit 301 and the antenna 304.

INDUSTRIAL APPLICABILITY

The present invention can be used for a communication apparatus such as a mobile phone or a wireless LAN, and is useful in, for example, ensuring a wide dynamic range.

DESCRIPTION OF THE REFERENCE CHARACTERS 100, 200, 900 transmission circuit
110, 910 radio frequency integrated circuit (RF-IC)
120, 220, 920 control voltage supply section
130, 930 power amplifier (PA)
131 power amplification module
111, 911 signal generation section
112, 912 DA converter (DAC)
113, 913 phase modulator (PM)
114, 914 variable gain adjustment section (VGA)
121, 221 bias current supply section
122, 222 control voltage supply section
300 communication apparatus
301 transmission circuit
302 reception circuit
303 antenna duplexer section

The invention claimed is:

1. A transmission circuit that polar-modulates an input signal by switching an operation mode between a high-output mode in which the transmission circuit operates in a high-output region and a low-output mode in which the transmission circuit operates in a low-output region, the transmission circuit comprising:
a signal generation section that generates an amplitude signal and a phase signal on the basis of the input signal;
an amplitude signal driving section that generates a first control voltage based on the amplitude signal in the high-output mode, and generates a second control voltage at a predetermined level and a first bias current based on the amplitude signal in the low-output mode;
a variable gain adjustment section that adjusts a power level of the phase signal; and
a power amplifier: to a power supply terminal of which the first control voltage is supplied and which amplitude-modulates the phase signal having the adjusted power level on the basis of the first control voltage, in the high-output mode; and to the power supply terminal of which the second control voltage is supplied and to an input terminal of which the first bias current is supplied and which amplitude-modulates the phase signal having the adjusted power level on the basis of the first bias current and the second control voltage, in the low-output mode, wherein
in a specific region in the low-output region and close to the high-output region,
the variable gain adjustment section adjusts the power level of the phase signal to a predetermined upper-limit level, and
the amplitude signal driving section operates in a special low-output mode in which a gain of the power amplifier is adjusted by changing the second control voltage and the first bias current to obtain a desired output power level.

2. The transmission circuit according to claim 1, wherein in the special low-output mode, the amplitude signal driving section increases the gain of the power amplifier in order to compensate for a difference between an input power level of the power amplifier in linear operation and the predetermined upper-limit level.

3. The transmission circuit according to claim 2, wherein in the special low-output mode, the amplitude signal driving section generates a third control voltage having a higher value of voltage than that of the second control voltage, and also generates a second bias current having a greater amount of current than that of the first bias current.

4. The transmission circuit according to claim 1, wherein the low-output region includes a low-distortion region where a small deterioration of distortion characteristics is caused and a distortion characteristics deterioration region where a greater deterioration of the distortion characteristics than that of the low-distortion region is caused, and
the specific region in the low-output region and close to the high-output region is the distortion characteristics deterioration region.

5. The transmission circuit according to claim 1, wherein the transmission circuit switches the operation mode to any one of the high-output mode, the low-output mode, and the special low-output mode in accordance with an output power level of the power amplifier.

6. The transmission circuit according to claim 5, wherein the transmission circuit switches the operation mode to any one of the high-output mode, the low-output mode, and the special low-output mode on the basis of a lookup table that defines the output power level of the power amplifier and the operation mode.

7. The transmission circuit according to claim 5, wherein the transmission circuit switches the operation mode to: the low-output mode when the output power level of the power amplifier is less than a first threshold; the special low-output mode when the output power level of the power amplifier is less than a second threshold and equal to or greater than the first threshold; and the high-output mode when the output power level of the power amplifier is equal to or greater than the second threshold.

8. The transmission circuit according to claim 1, wherein the transmission circuit causes the power amplifier to operate in a saturation region in the high-output mode, and causes the power amplifier to operate in a linear region in the low-output mode and the special low-output mode.

9. A communication apparatus comprising:
a transmission circuit that generates a transmission signal; and
an antenna that outputs the transmission signal generated by the transmission circuit, wherein
the transmission circuit is the transmission circuit according to claim 1.

10. The communication apparatus according to claim 9, further comprising:
a reception circuit that processes a reception signal received from the antenna; and
an antenna duplexer that outputs to the antenna the transmission signal generated by the transmission circuit, and outputs to the reception circuit the reception signal received from the antenna.

11. A method of polar-modulating an input signal by switching an operation mode between a high-output mode in which an operation is performed in a high-output region and a low-output mode in which the operation is performed in a low-output region, the method comprising:
a signal generation step of generating an amplitude signal and a phase signal on the basis of the input signal;
an amplitude signal driving step of generating a first control voltage based on the amplitude signal in the high-output mode, and generating a second control voltage at a predetermined level and a bias current based on the amplitude signal in the low-output mode;
a variable gain adjustment step of adjusting a power level of the phase signal; and
an amplitude modulation step, using a power amplifier, of: amplitude-modulating the phase signal having the adjusted power level on the basis of the first control voltage supplied to a power supply terminal of the power amplifier, in the high-output mode; and amplitude-modulating the phase signal having the adjusted power level on the basis of the bias current supplied to an input terminal of the power amplifier and the second control voltage supplied to the power supply terminal, in the low-output mode, wherein
in a specific region in the low-output region and close to the high-output region,
in the variable gain adjustment step, the power level of the phase signal is adjusted to a predetermined upper-limit level, and
in the amplitude signal driving step, a gain of the power amplifier is adjusted by changing the second control voltage and the bias current to obtain a desired output power level.

* * * * *